(12) United States Patent
Kan

(10) Patent No.: US 12,174,698 B2
(45) Date of Patent: Dec. 24, 2024

(54) APPARATUS FOR ON DEMAND ACCESS AND CACHE ENCODING OF REPAIR DATA

(71) Applicant: Cypress Semiconductor Corporation, San Jose, CA (US)

(72) Inventor: Senwen Kan, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 162 days.

(21) Appl. No.: 17/703,856

(22) Filed: Mar. 24, 2022

(65) Prior Publication Data
US 2023/0305920 A1 Sep. 28, 2023

(51) Int. Cl.
| | | |
|---|---|---|
| G06F 11/10 | (2006.01) | |
| G06F 12/0802 | (2016.01) | |
| G11C 29/12 | (2006.01) | |
| G11C 29/44 | (2006.01) | |

(52) U.S. Cl.
CPC ...... *G06F 11/1064* (2013.01); *G06F 12/0802* (2013.01); *G11C 29/12* (2013.01); *G11C 29/44* (2013.01)

(58) Field of Classification Search
None
See application file for complete search history.

(56) References Cited

U.S. PATENT DOCUMENTS

| | | | | |
|---|---|---|---|---|
| 7,143,243 B2* | 11/2006 | Miller | ............... | G06F 12/0882 |
| | | | | 711/138 |
| 2006/0085700 A1* | 4/2006 | Fong | ............... | G11C 15/00 |
| | | | | 714/710 |
| 2008/0019198 A1* | 1/2008 | Co | ............... | G11C 29/88 |
| | | | | 365/201 |
| 2013/0021861 A1* | 1/2013 | Shvydun | ............... | G11C 29/72 |
| | | | | 365/200 |

FOREIGN PATENT DOCUMENTS

WO    WO-2006039406 A1 *  4/2006   ........... G11C 29/808

* cited by examiner

*Primary Examiner* — April Y Blair
*Assistant Examiner* — Matthew W Wahlin

(57) ABSTRACT

An apparatus for on demand access and cache encoding of repair data. In one embodiment the apparatus includes an integrated circuit having a data cache in data communication with a non-volatile memory, a controller of a built-in self-test-and-repair (BISTR) circuit, and a plurality of registers. The controller is configured to read data from the data cache and store it into a first of the plurality of registers.

20 Claims, 9 Drawing Sheets

APPARATUS FOR ON DEMAND ACCESS AND CACHE ENCODING OF REPAIR DATA

TECHNICAL FIELD

The present disclosure relates generally to the field of memory devices, and more particularly, to systems and methods for on demand access and cache encoding of memory repair data.

BACKGROUND

Integrated circuits (ICs) are experiencing continuous improvements in the integration density of various components (i.e., transistors, diodes, resistors, capacitors, etc.). For the most part, improvement in integration density has come from repeated reductions in minimum component feature size (e.g., gate width), allowing more components to be integrated into a given IC die area.

Memories, either volatile or non-volatile, are among the most widely used cores in ICs. Advanced memories have high component densities and occupy large areas of the die that contains the IC. The probability a defect lies within memory increases with component density.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

Figure 1:
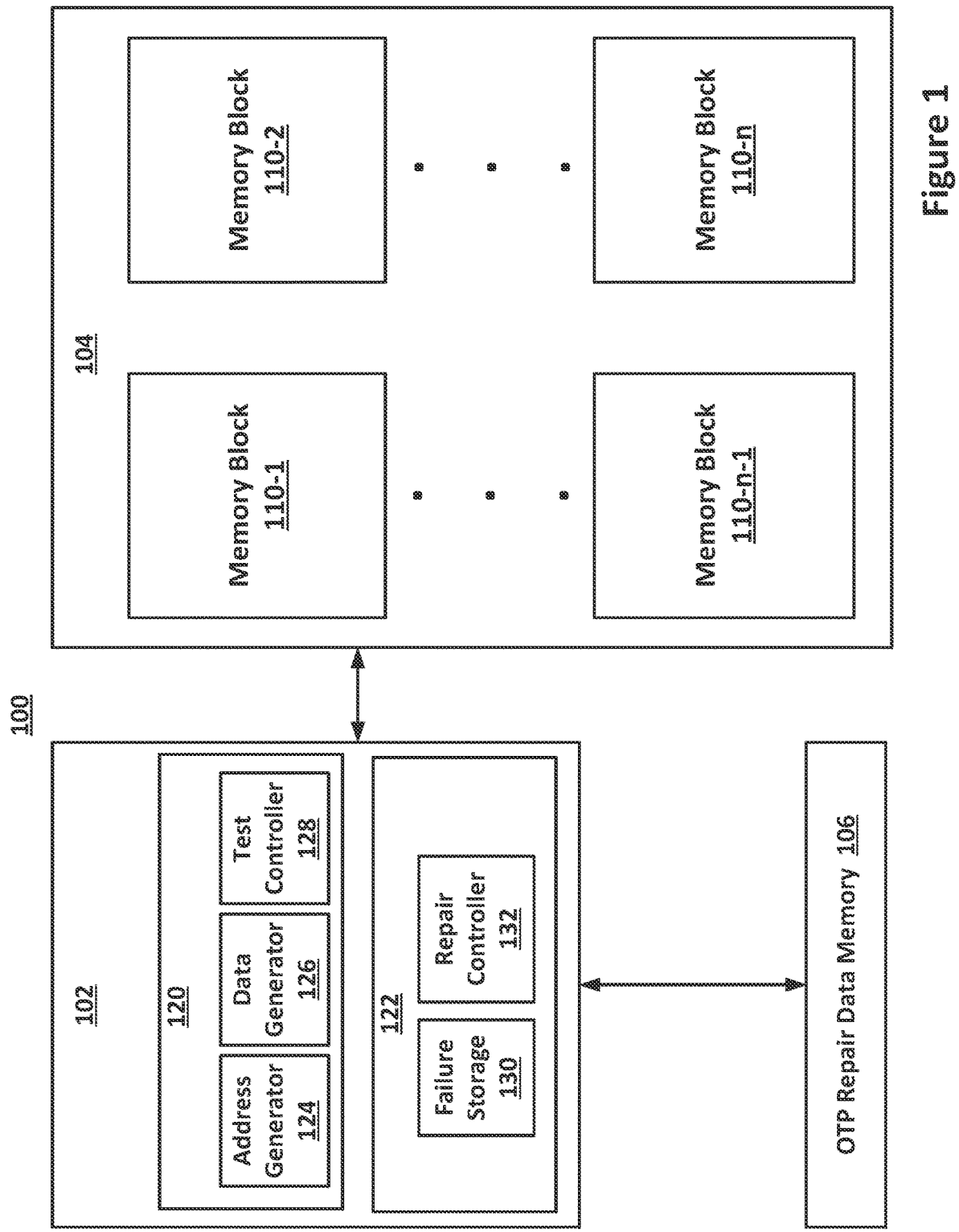
FIG. 1 is a block diagram illustrating relevant components of an IC employing built-in self-test-and-repair.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The probability a defect lies within memory increases as component integration density increases. Defective memories can lead to lower IC production yields since ICs with excessive memory defects must be scrapped. Many defective memories can be repaired, and production yields can increase if ICs employ built-in self-test-and-repair (BISTR), redundant rows and/or columns of memory.

Figure 2:
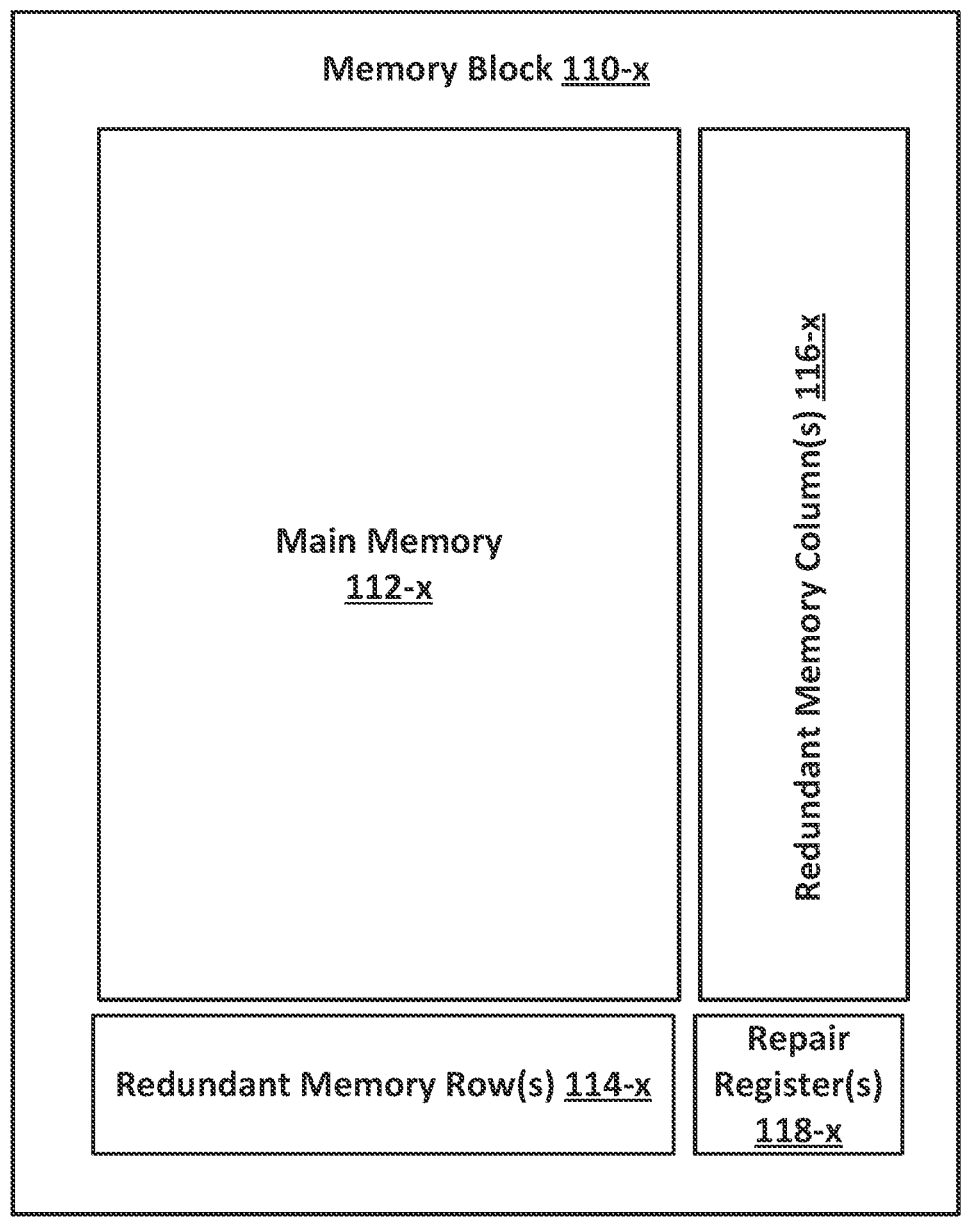
FIG. 2 is a block diagram illustrating relevant components of a memory block within the IC, which contains one or more repair registers and redundant memory.

FIG. 1 is a block diagram of an IC 100 with BISTR module 102, a core memory 104, and a one-time programmable memory (OTP) repair data memory 106 that contains non-volatile memory cells such as efuse-based cells or antifuse-based cells. Core memory 104 includes sub-memory blocks 110-1-110-n, where n is an integer. FIG. 2 is a block diagram of an example block 110-x, where x is an integer. Memory block 110-x includes main memory 112-x, rows 114-x of redundant memory, columns 116-x of redundant memory, and programmable repair registers 118-x. Memory cells in main memory 112-x, redundant rows 114-x and redundant columns 116-x can be dynamic random-access memory (DRAM) cells, static random-access memory (SRAM) cells, etc.

The main memory 112-x has m rows and p columns. M and p are integers. Redundant rows 114-x can be used for repairing rows in main memory 112-x with faulty cells, and redundant columns 114-x can be used for repairing columns in main memory 112-x with faulty cells. If a column within main memory 112-x includes one or more faulty cells, the defective column can be repaired by effectively replacing it with one of the redundant columns 114-x. Similarly, if a row within main memory 112-x includes one or more faulty cells, the defective row can be repaired by effectively replacing it with one of the redundant rows 114-x.

The numbers of redundant rows 112-x and columns 114-x may depend on the size of main memory 112-x and also on the processes used to manufacture main memory 112-x. Larger main memory 112-x may require more redundant rows and columns to assist in failed cell repair. In addition, if the processes used to manufacture the device have high yield, the numbers of redundant rows and columns could be lower. In contrast, if the processes have low yield, the numbers of redundant rows and columns should be higher.

Repair registers 118-x can be programmed with repair data. The repair data can map a defective row in main memory 112-x to a row within redundant rows 112-x, or a defective column in main memory 112-x to a column within redundant columns 114-x. If main memory 112-x lacks a faulty cell, repair register 118-x is programmed with repair data set to null or zero. For purposes of explanation only, it will be presumed that each memory block 110 includes a single repair register 118-x, it being understood that each memory block 110 may include multiple repair registers. Moreover, on IC 100 power-up, all repair registers 18 are initialized to zero or null data in one embodiment.

With continuing reference to FIGS. 1 and 2, BISTR module 102 operates to test and repair memory blocks 110. BISTR module 102 includes a built-in self-test (BIST) module 120 for testing memory blocks 110, and a built-in self-repair (BISR) module 122 for repairing memory blocks 110. BISR module 122 repairs memory blocks 110 by programming repair registers 118 with repair data.

The BIST module 120 includes an address generator 124, which generates and provides address sequences for accessing memory blocks 110 during testing. The BIST module 120 further includes a data generator 126, which generates and provides test data sequences that are stored in memory blocks 110 during testing. The address sequences and the data sequences are generated in accordance with test pattern algorithms. The data sequences may provide a set of data bits designed to identify various types of faults within memory blocks 110. The BIST module 130 also includes a test state controller 128, which provides inputs and control signals to the address generator 124 and the data generator 126. The test pattern algorithms described above may be generated by the test state controller 128. The BIST module 120 can scan main memories 110 by row, by column, or a combination of both to test all of the blocks 110.

The BISR module 122 analyzes error (or failure) data received from testing memory blocks 110. The error (or failure) data may include the identities of faulty memory cells, which in turn can be used to determine an appropriate repair mechanism. Depending on the location and distribution of the failed memory cells, the repair could be done by row repair, column repair, or both where multiple repair registers are employed in the memory blocks 110. The BISR module 122 includes a failure storage 130, which stores identities of faulty memory cells. The BISR module 122 further includes a repair controller 132. The repair controller 132 analyzes the data stored in failure storage 130 and determines the repair method using one or more algorithms. After the repair controller 132 determines the repair method, the repair controller selects and programs repair registers 118 with non-zero repair data.

IC 100 may be subjected to several test/repair sessions. After each test/repair session repair controller 132 compresses and stores the contents of all repair registers 118 to OTP memory 106 to ensure the repair data is not lost when power to the IC 100 is turned off.

If all memory cell faults are successfully repaired after the test/repair sessions, IC 100 is shipped to a customer for use in a product. At power-up, repair controller loads registers 118 with repair data read from OTP memory 106. Each time memory 104 is accessed for a read or write operation, a portion of the read/write address is checked against repair data in one or more repair registers 118 to see if the read/write operation should be redirected to a redundant row or redundant column. If the answer is yes, the read/write is performed in the redundant row or column.

ICs like example IC 100 typically require multiple test/repair sessions that employ distinct testing algorithms. Each test/repair session may discover new faulty memory cells. After each test/repair session, repair data is written to OTP memory 106 for each of the repair registers 118 in blocks 110-1-110-$n$, regardless of whether the register has zero or non-zero repair data in it. For purposes of explanation only, repair data written for each repair register 118 is one byte in length. Most of the blocks 110-1-110-$n$ will not have a faulty memory cell. As a result, most of the n bytes of repair data written to OTP memory 106 will be zero (i.e., eight bits of logic zero).

Data compression (e.g., zero-based data compression) can be used to reduce the size data written to OTP memory 106 after each test/repair session. Many different compression methods can be used. Simple compression algorithms like zero-based data compression are employed to reduce the complexity and cost. In zero-based data compression a repair data byte set to zero can be replaced with bit pattern "111," two consecutive repair data bytes set to zero can be replaced with the bit pattern "1111." One downside of zero-based compression, however, is that the size of compressed repair data can increase with each test/repair session since subsequent sessions will likely identify new faulty memory cells, and since repair data must be accumulated with each test/repair session. For example, suppose there are n=100 memory blocks in IC 100. After completion of a first test/repair session, only memory blocks 110-2 and 110-25 are found to contain faulty memory cells. Repair data from all repair registers 118 are collected, compressed and stored in a first segment of OTP memory 106. Repair data bytes from registers 118 of blocks 110-2 and 110-25 are not compressed, but all other repair data bytes are zero and compressed accordingly. After completion of the second test/repair session, memory block 110-87 is also found to include a faulty cell. Repair data from all repair registers 118 are collected, compressed and stored in a second segment of OTP memory 106. Repair data bytes from registers 118 of blocks 110-2, 110-25, and 110-87 are not compressed, but all other repair data bytes are compressed. The compressed data for the second test/repair session requires more storage in OTP memory than the compressed data for the first test/repair session. The process continues with each successive test/repair session.

OTP memory 106 is portioned into dedicated segments to store compressed repair data for respective test/repair sessions. For example, OTP memory 106 can have q segments to store compressed repair data of q test/repair sessions, respectively. The quantity of compressed repair data to be written to an OTP memory segment after each test/repair session is unknown before the test/repair session is started; some ICs of a wafer lot may be more defective than other ICs in the wafer lot. Accordingly segments of OTP memory 106 should be sized to accommodate worse case scenarios. In many instances this leads to unused storage in the q segments in particular, and the OTP memory 106 in general. Another problem is that cells of OTP memory 106 may be costlier than cells in memory 104. Using designated segments of OTP memory 106 for multi-session testing increases the area on the die, which is also undesirable. The slow speed at which OTP memory is accessed is also undesirable.

The present disclosure addresses these problems and others and provides a method and apparatus for caching non-zero repair data. In one embodiment, the apparatus includes a repair data cache that works alongside a non-volatile OTP data repair memory. Use of the repair data cache can reduce the size of the OTP memory that is otherwise needed.

Cache memory is faster than OTP memory. A repair controller can load repair registers 118 faster with repair data read from a cache than with repair data read from OTP memory. The present disclosure provides additional advantages. For example, repair data need not be compressed before it is stored in the repair data cache and/or in OTP memory. This contributes not only to further increases in the speed at which repair registers 118 can be loaded, but it also reduces the complexity and cost of memory test and repair.

Figure 3:
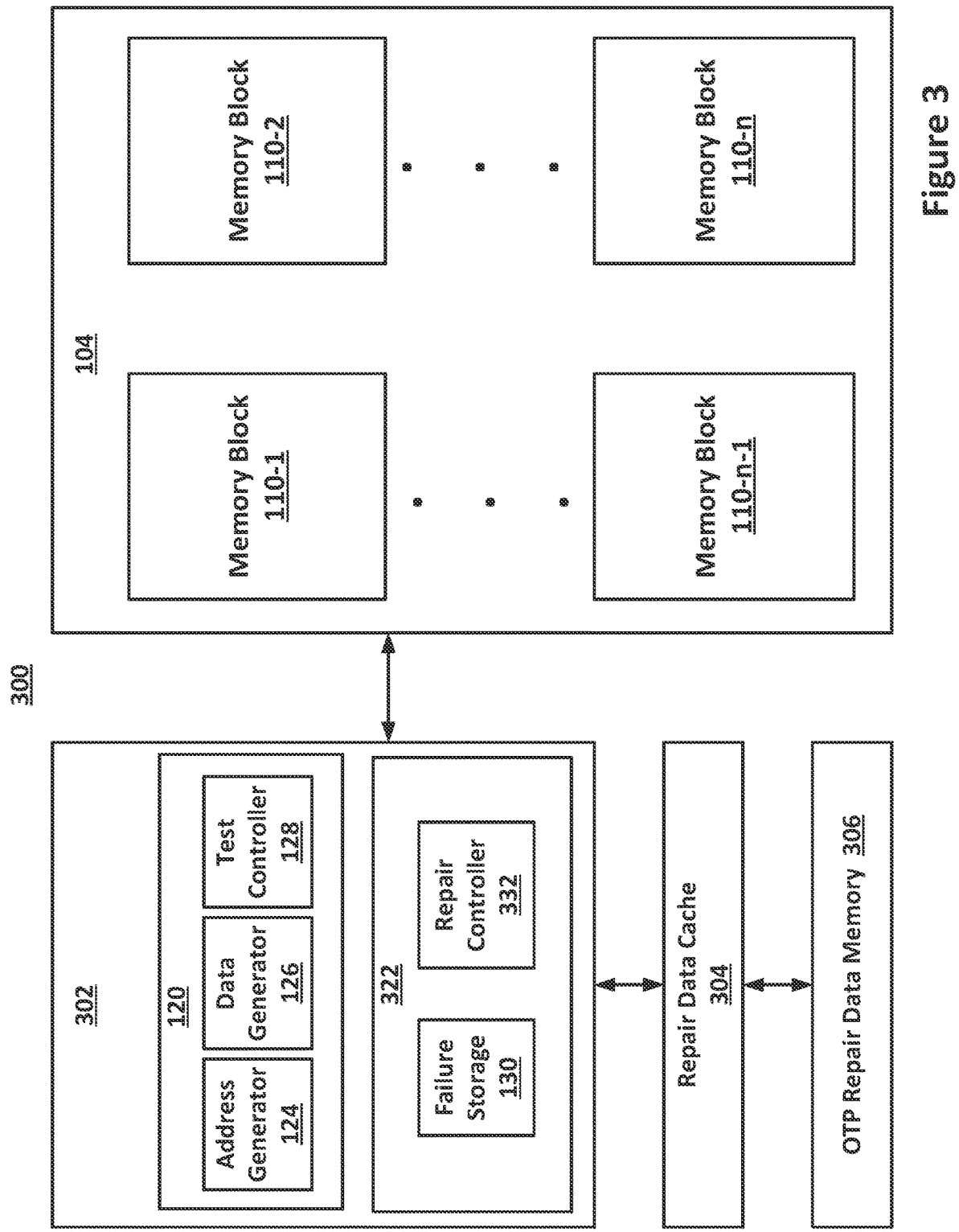
FIG. 3 is a block diagram illustrating relevant components of an IC employing one embodiment of the present disclosure.

FIG. 3 is a block diagram showing relevant components of an IC 300 employing one embodiment of the present disclosure. IC 300 may take form in an application-specific integrated circuit (ASIC), an SoC, etc. IC 300 includes BISTR module 302, a repair data cache 304, a core memory 104, and an OTP repair data memory 306.

Core memories 104 in FIGS. 1 and 3 are presumed to be identical. Repair data cache 304 includes dynamic random-access memory (DRAM) cells, static random-access memory (SRAM) cells, flip flops, register banks, etc. Like OTP repair data memory 106, OTP repair data memory 306 contains non-volatile memory cells such as efuse-based cells or antifuse-based cells. OTP memory 306, however, is substantially smaller than OTP memory 106 shown in FIG. 1. In one embodiment OTP memory 306 has a storage location for each repair register 118 in memory blocks 110-1-110-*n*. In another embodiment, OTP memory has a storage location for each line in repair data cache 304 that can store repair data.

With continuing reference to FIGS. 2 and 3, BISTR module 302 tests and repairs memory blocks 110. BISTR module 302 includes built-in self-test (BIST) module 120 for testing blocks 110 and built-in self-repair (BISR) module 322 for repairing blocks 110.

The BIST module 120 includes address generator 124, which generates and provides address sequences for accessing blocks 110 during testing. The BIST module 120 further includes a data generator 126, which generates and provides test data sequences that are stored in blocks 110 during testing. The address sequences and the data sequences are generated in accordance with test pattern algorithms. The BIST module 120 includes test state controller 128, which provides inputs and control signals to the address generator 124 and the data generator 126. BIST module 120 scans main memories 110 by row, by column, or a combination of both to test all of the blocks 110.

BISR module 322 analyzes failure data received from testing memory blocks 110. The failure data may include the identities of faulty memory cells, which in turn can be used to determine a repair mechanism. Depending on the location and distribution of the failed memory cells, repair can be done by row or column repair in a manner similar to that described above.

The BISR module 322 includes a failure storage 130, which stores the identities of faulty memory cells. BISR module 322 further includes a repair controller 332. The repair controller 332 analyzes the data stored in failure storage 130 and uses appropriate algorithms to repair faulty memory cells. After the repair controller 332 determines a repair method, the repair controller programs the appropriate repair registers 118 with non-zero repair data.

IC 300 may be subjected to several test/repair sessions. Newly identified non-zero repair data can be written to repair registers 118 during each test/repair session. The newly identified non-zero repair data may also be written to repair data cache 304 and OTP memory 306 during each test/repair session. Non-zero repair data is written to OTP memory 306 to ensure the repair data is not lost when power to the IC 300 is turned off. Newly identified non-zero repair data can be written to OTP memory 306 after it is stored in repair data cache 304. Only non-zero repair data is written to OTP memory 306 and repair data cache. In one embodiment, the non-zero repair data is not compressed before it is written to OTP memory 306 or repair data cache 304. After power-up of IC 300 repair controller 332 can load repair registers 118 with non-zero repair data that is read from repair data cache 304 as will be more fully described.

IC 300 may require multiple test/repair sessions that employ distinct testing algorithms. Repair controller can write new repair data to one or more repair registers 118 during each test/repair session. Repair controller 332 can also write the new non-zero repair data to OTP memory 306 via repair data cache 304 during each test/repair session. Repair controller 332 may include a translator or lookup table that maps addresses of repair registers 118 to respective addresses in OTP memory 306. In one embodiment, OTP memory 306 has n locations for storing repair data. Repair data cache 304 can also have n locations or lines for storing repair data. Locations in OTP memory 306 are dynamically allocated to store non-zero repair data as needed. In one embodiment, repair controller may include a lookup table stored in non-volatile memory that maps addresses of registers 118 to addresses in OTP memory 306. This lookup table may updated with new OTP memory and repair address mappings during each test/repair session.

Figure 4:
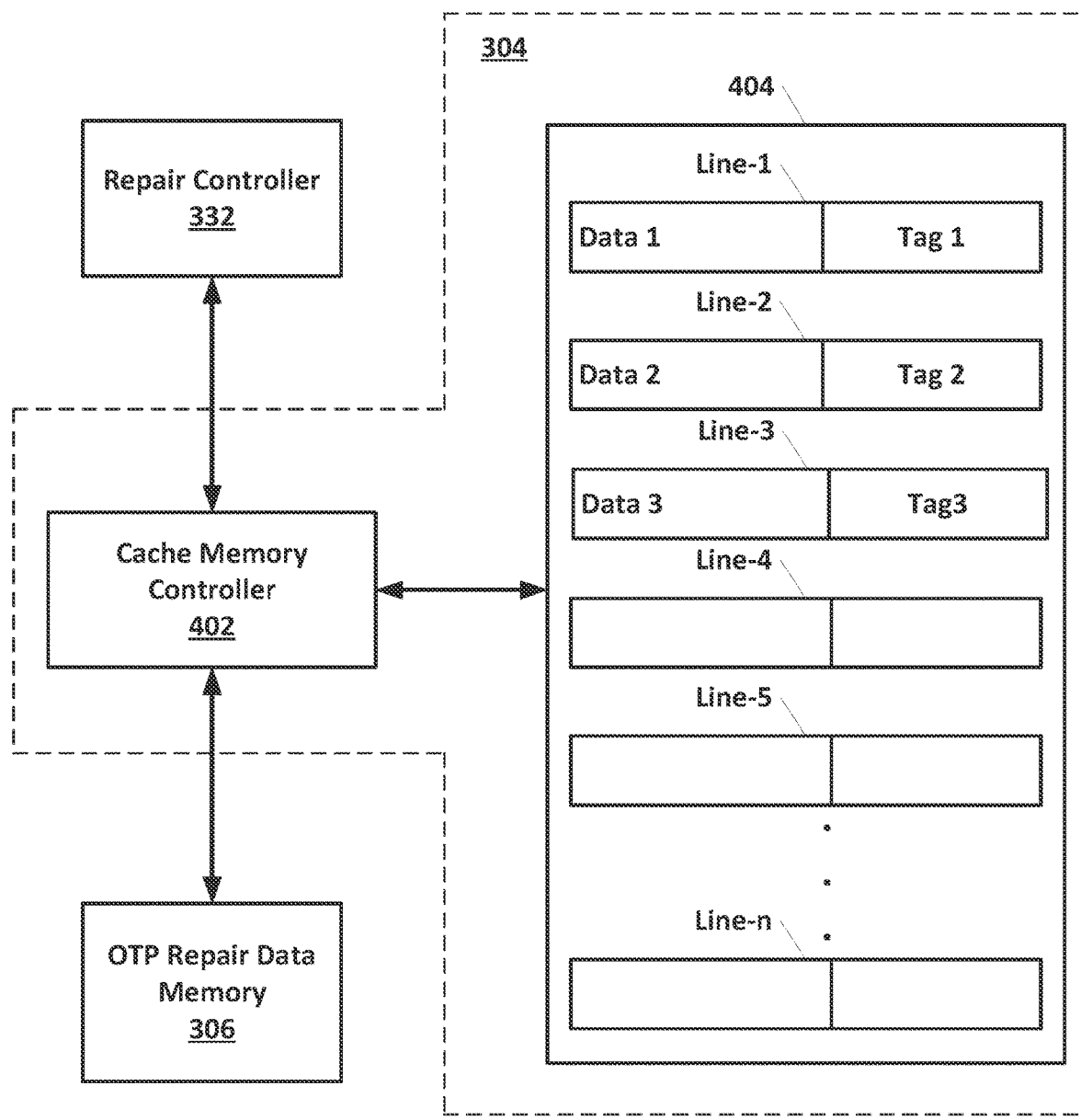
FIG. 4 is a block diagram illustrating relevant components of a repair cache employed in the IC of FIG. 3.

FIG. 4 illustrates relevant components of repair data cache 304 according to one embodiment. Repair data cache 304 includes repair data cache controller 402 in data communication with data cache memory 404. Repair data cache controller 402 is also in data communication with repair controller 332 and OTP memory 306. Data cache memory 404 is configured with n storage lines, each of which can store a tag and corresponding repair data. In one embodiment, each tag includes the upper bits of an address in OTP memory 306 where the corresponding repair data is also stored. Each line may also include a parity bit for the repair data. FIG. 4 shows line-1-line-3 storing example repair data and tags. Each line is accessible by cache memory controller 402.

Figure 5A:
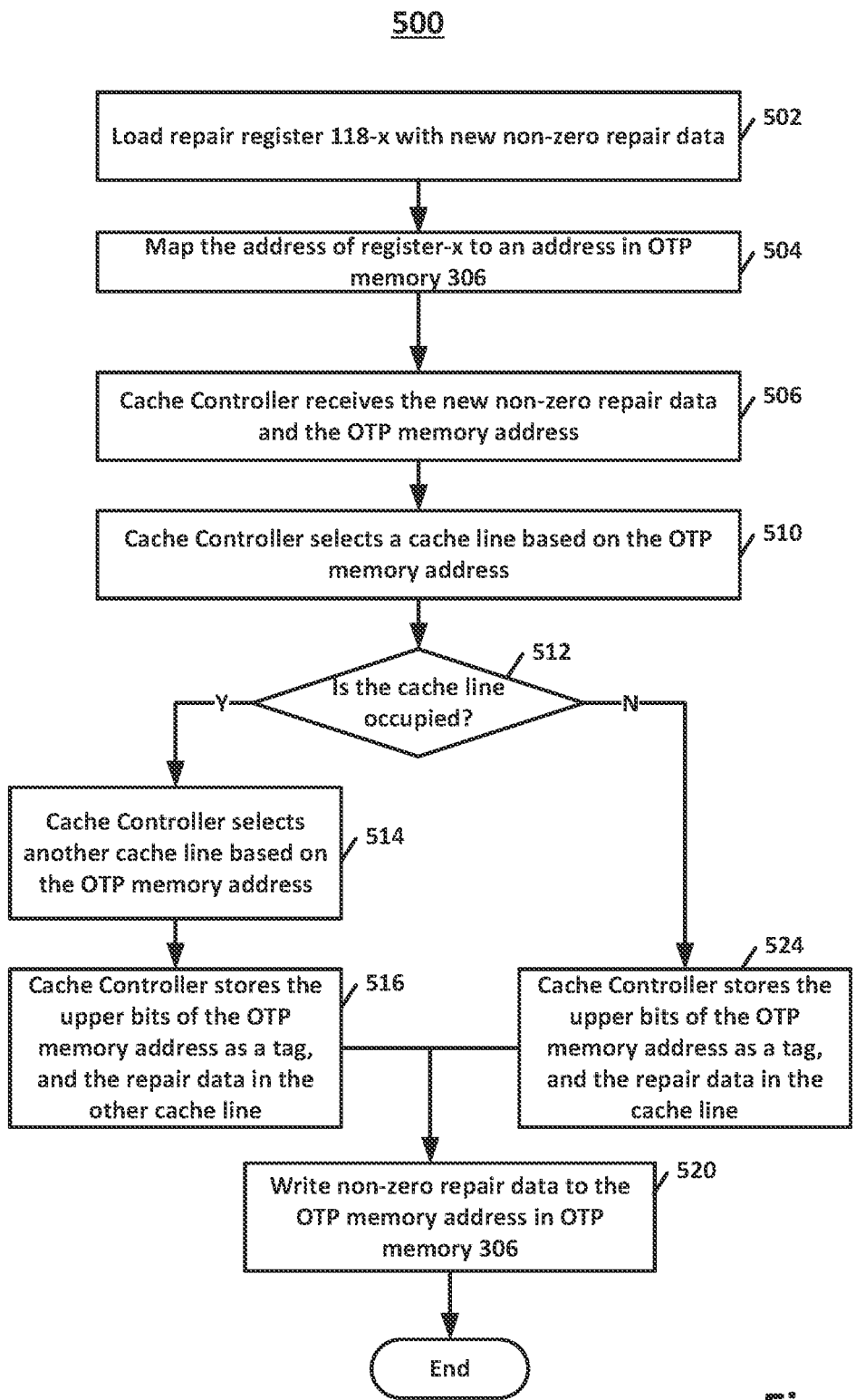
FIGS. 5a and 5b are flow diagrams of methods for operating the repair controller and data cache controller of FIGS. 3 and 4.

With continuing reference to FIGS. 3 and 4, FIG. 5*a* illustrates relevant steps of an example method 500 implemented by repair controller 332 and cache memory controller 402 during a test/repair session. As noted above repair controller 332 may write new non-zero repair data to one or more repair registers 118 during a test/repair session. The new non-zero repair data should also be written to OTP memory 306 and data cache memory 404. The process in FIG. 5*a* illustrates relevant aspects of writing new repair data to OTP memory 306 and cache memory 404. The process starts with repair controller 332 writing new non-zero repair data to a repair register 118-*x*. In one embodiment, repair controller 332 updates an address translation module or lookup table to map the address of register 118-*x* to an address in OTP memory 306 in step 504. In step 506 cache controller 402 receives the new non-zero repair data and its corresponding OTP memory address. Cache controller 402 selects a cache line based upon the OTP memory address. In one embodiment, cache controller 402 selects the cache line by first performing a Modulo calculation on the OTP memory address. For example, cache controller 402 calculates Modulo16 for the OTP memory address. The remainder of the Modulo calculation identifies a line number in cache memory 404. Cache data controller 402 accesses the cache line identified by the Modulo calculation. In step 512 cache controller 512 determines whether the cache line is occupied with repair data. If not, then in step 524 cache controller stores the upper bits of the OTP memory address as a tag within the selected cache line. Cache controller 402 also stores the new non-zero repair data in the selected cache line. Optionally, cache controller 332 calculates and stores a parity bit for the repair data in the selected cache line. If, however, cache controller 332 determines in step 512 the selected cache line is occupied in step 512, then the cache controller 402 selects another cache line based upon the OTP memory address. In one embodiment, this other cache line is selected by first adding an integer (e.g., eight) to the OTP memory address identified in step 504. Cache controller 402 then performs a Modulo calculation on this modified OTP memory address. Cache controller 402 stores the non-zero repair data, the upper bits of the OTP memory address as a tag, and an optional parity bit in the cache line identified by the remainder of the second Modulo calculation. In one embodiment, the cache controller 402 may generate an error if the other cache line is previously occupied by repair data. For purposes of explanation only, it will be presumed the other line in cache memory 404 is not occupied. Regardless of whether the cache controller 402 stores the new non-zero repair address in step 516 or 524, the repair data is also provided to OTP memory 306 for storage at the OTP memory address identified in step 504. The process may repeat if more non-zero repair data is identified during the test/repair session.

Figure 5B:
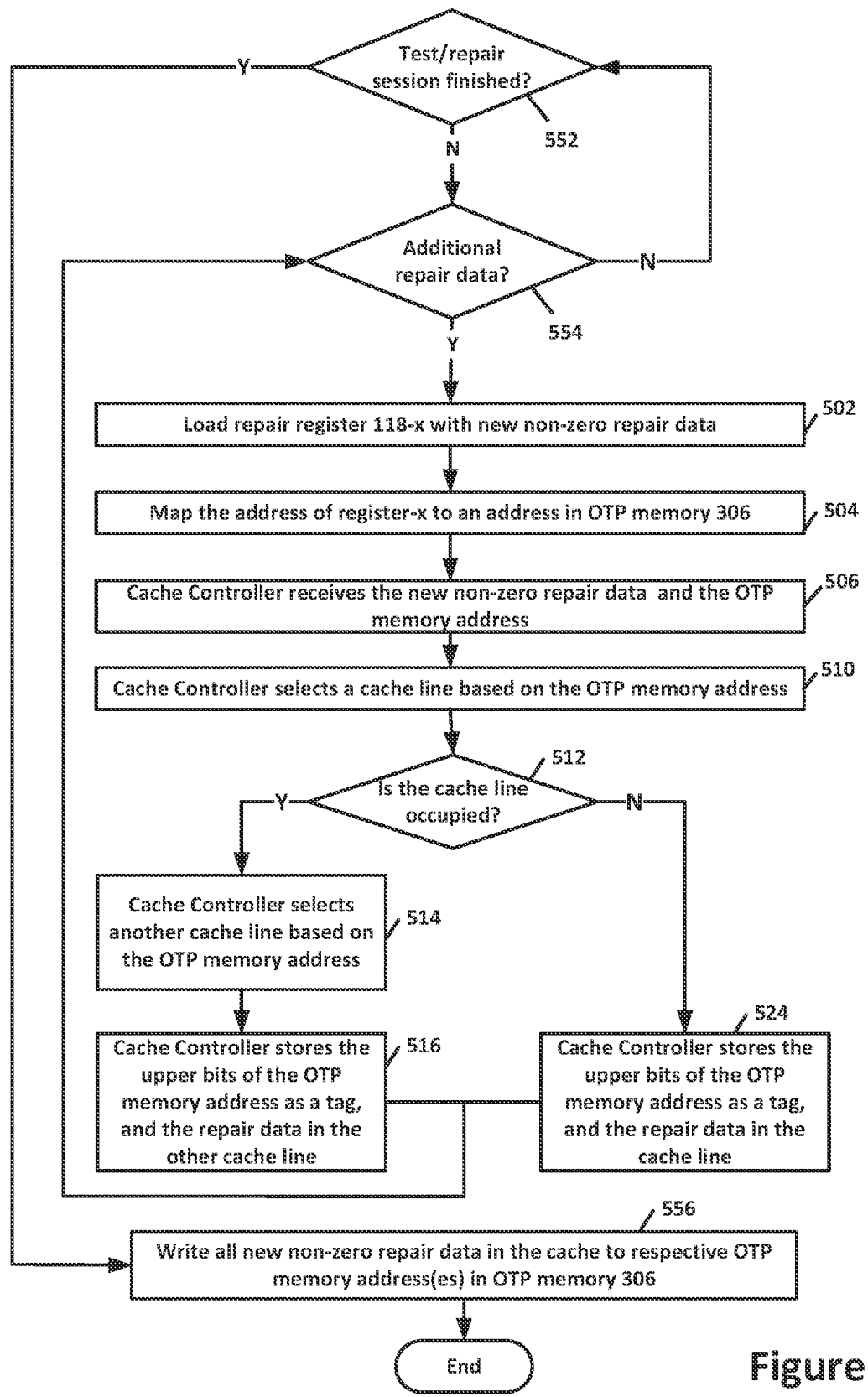

FIG. 5b illustrates relevant aspects an alternative method 550, which includes storing repair data into OTP memory 303 after the test/repair session is completed. Many of the steps shown in FIGS. 5a and 5b are common. For example, both methods 500 and 550 contain steps 502-524. However, method 550 shown in FIG. 5b lacks step 520 or writing new repair data to OTP memory 306 at each point when repair data is written to cache memory 404. Rather, method 550 includes step 556 in which all new non-zero repair data that was written to the cache, is copied to OTP memory 306 at the appropriate OTP memory addresses after the test/repair session has completed. Furthermore, since empty cache lines can be incrementally updated with non-zero repair data, for each test/repair session, the repair cache contents stored on the OTP memory 303 can be loaded into the repair cache in 404 first by the cache controller 402, and subsequent repair controller 332 access to the cache controller 402 will further update repair cache 404. After all repair data is cached into cache memory 404 in a separate test/repair session, the updated repair cache can then be written into OTP memory 303 since only new data is accumulated into the repair cache memory 404.

Figure 6:
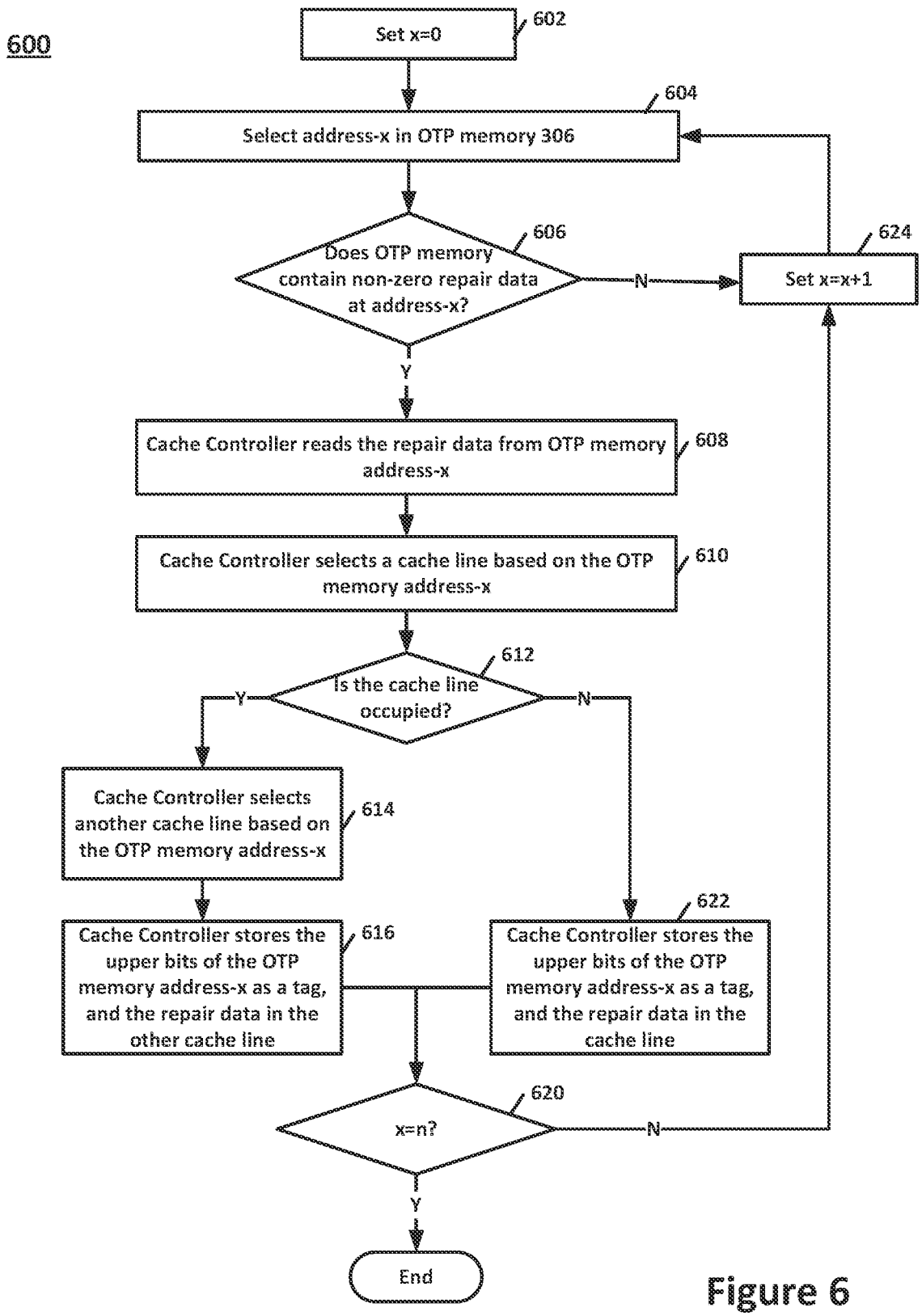
FIG. 6 is a flow diagram of another method of operating the repair controller and data cache controller of FIGS. 3 and 4.

When power to IC 300 is turned off, the data contents of cache memory 404 and repair registers 118 are lost. On power-up, cache memory 404 and repair registers 118 can be restored to the state that existed before power was turned off. FIG. 6 is an example process for loading cache memory 404 with non-zero repair data stored in OTP memory 306. This process can be started on power-up of IC 300. At step 602 repair cache controller 402 sets a counter x=0. Cache controller accesses address-x in OTP memory 306 to determine whether it contains non-zero repair data. If OTP memory 306 does not contain non-zero repair data at address-x, data cache controller 402 increments counter x as shown in step 624, and step 606 is repeated. However, if OTP memory 306 contains non-zero repair data at address-x, the data is read as shown in step 608. Cache controller 402 then selects a cache line based on the OTP memory address-x in much the same manner as described above with reference to FIG. 5a. Cache controller 402 performs a Modulo calculation on the OTP memory address-x. The result of the calculation identities a cache line number. Cache data controller 402 accesses the cache line identified by the Modulo calculation. In step 612 cache controller 402 determines whether the cache line is occupied with repair data. If the cache line is empty, then in step 622 cache controller 402 stores the upper bits of the OTP memory address-x as a tag, the repair data, and optionally a parity bit within the selected cache line. If, however, cache controller 402 determines that the selected cache line is occupied in step 612, then the cache controller 402 selects another cache line based upon the OTP memory address-x. In one embodiment, this other cache line is selected by first adding an integer (e.g., eight) to the OTP memory address-x. Cache controller 402 then performs the Modulo calculation on this modified OTP memory address-x. Cache controller 402 stores the non-zero repair data, the upper bits of the OTP memory address-x as a tag, and optionally a parity bit in the cache line identified by the result of the second Modulo calculation. In one embodiment, the cache controller 402 might generate an error if the other cache line is previously occupied by repair data. For purposes of explanation only, it will be presumed the other line in cache memory 404 is empty. Data cache controller 402 checks to see if all n locations of OTP memory 306 have been checked for non-zero repair data in step 620. If not, repair cache controller 402 increments counter x as shown in step 624, and step 606 is repeated. After all locations of OTP memory 306 have been checked, process ends and cache memory 404 should be in the state it was when power to IC 300 was turned off.

Figure 7:
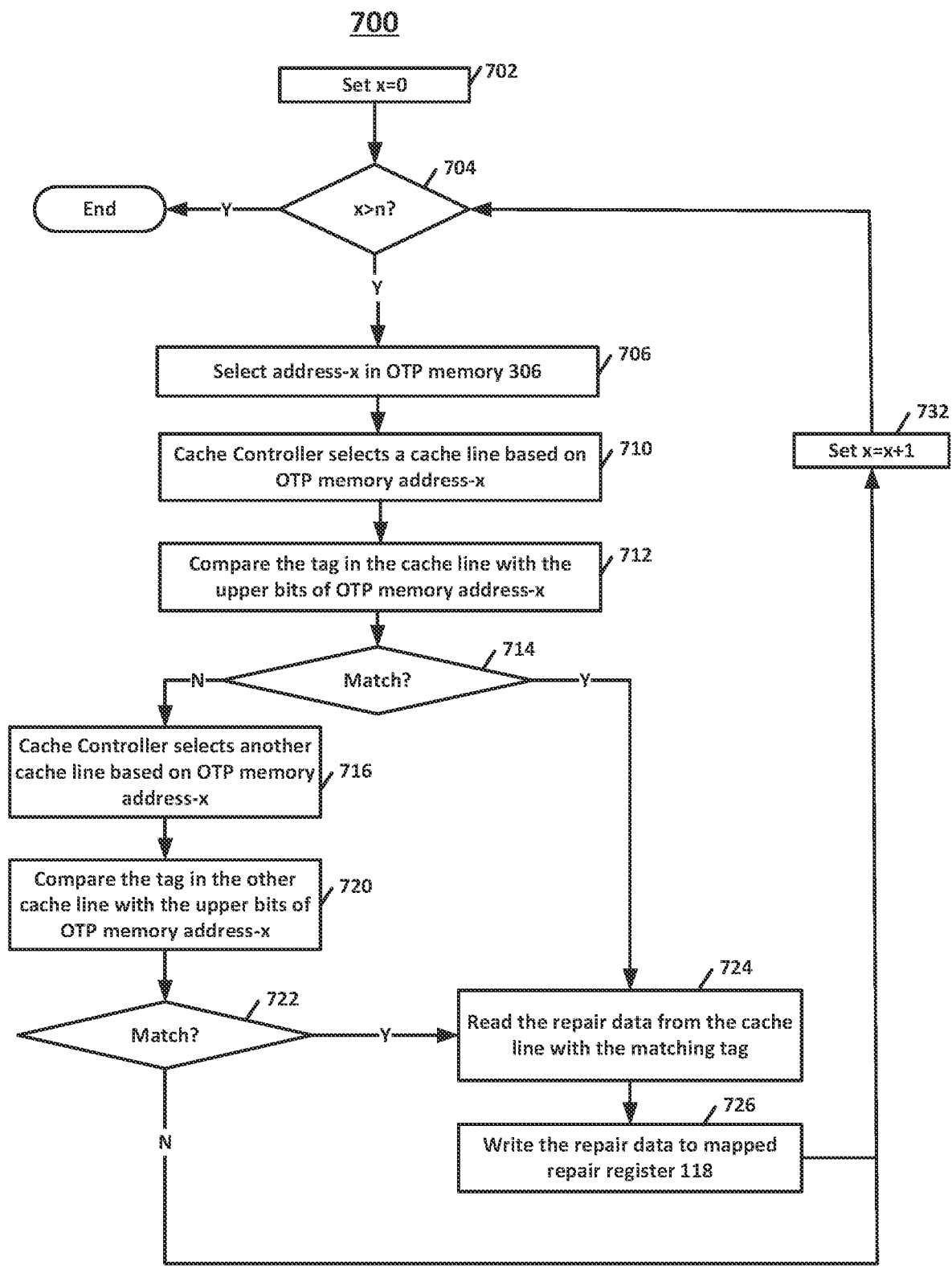
FIG. 7 is a flow diagram of still another method of operating the repair controller and data cache controller of FIGS. 3 and 4.

Repair registers 118 should also be reprogrammed with repair data at power-up of IC 300. After the process 600 of FIG. 6 ends or alternatively after the repair data cache 304 loads repair data from the OTP memory by itself, repair controller 332 can use repair data in cache memory 404 to reprogram repair registers 118. FIG. 7 is an example method 700 that illustrates relevant aspects in which repair registers 118 are reprogrammed. The process begins with step 702 in which repair controller 332 sets a counter x=0. OTP memory address-x is provided to cache controller 402. Cache controller 402 selects a line within cache memory 404 based on the OTP memory address-x as shown in step 710. In one embodiment cache controller 402 selects a cache line by performing a Modulo calculation on the OTP memory address-x. The result of the calculation identifies a cache line number. The tag in the selected cache line is compared with the upper bits of the OTP memory address-x. If there is a match, then in step 724 cache controller 402 reads the repair data from the selected cache line with the matching tag. Repair controller 332 uses a translation module or lookup table to map the OTP address-x to the address for a repair register. The repair data is provided to repair controller 332 for subsequent storage in the repair register 118 as shown in step 724 and 726. Cache controller 332 may check a parity bit against its corresponding repair data before the repair data is provided to repair controller. If, however, there is no match found in step 714 cache controller 402 selects another cache line based on the OTP memory address-x. In one embodiment this other cache line is selected by first adding an integer (e.g., eight) to the OTP memory address-x. Cache controller 402 then performs a Modulo calculation on the modified OTP memory address-x. The result of the Modulo calculation identifies the other cache line. Cache controller 402 accesses the other cache line and compares the tag in it with the upper bits of unmodified OTP memory address-x. If there is a match, then cache controller 402 reads the repair data from the other cache line with the matching tag as shown in step 724. This repair data is provided to repair controller 332 for subsequent storage in repair register 118 as shown in step 726. In one embodiment, the cache controller 402 might generate an error if the other cache line lacks a matching tag. Cache controller may also check a parity bit stored in the selected cache line against the repair data sent to repair controller 332.

Figure 8:
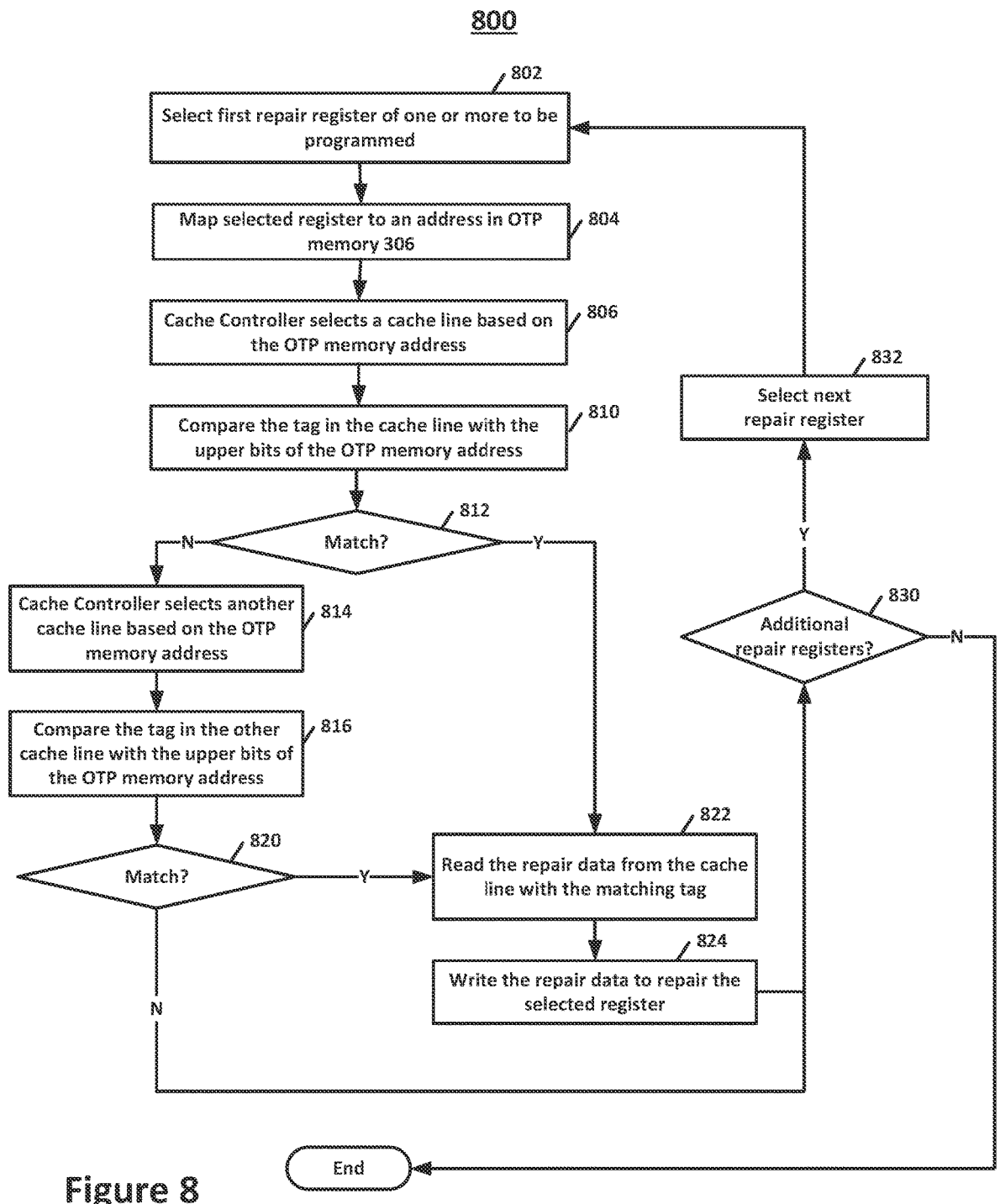
FIG. 8 is a flow diagram of yet another method of operating the repair controller and data cache controller of FIGS. 3 and 4.

Portions of IC 300 may be powered down, for example, to conserve energy. For example, power to memory blocks 110-1-110-6 can be turned off while the remaining components, including cache memory 404, remain powered up. The repair data in a repair register 118 is lost when it loses power. Cache memory 404 can be used to reprogram select repair registers 118 when power to them is restored. FIG. 8 is a process that illustrates relevant aspects of a method 800 for reprogramming selected repair registers after power to them is restored. The process begins with step 802 in which repair controller 332 selects the first of one or more repair registers 118 to which power has been restored. Repair controller 332 uses a translation module or lookup table to map the address for the selected repair register 118 to an address in OTP memory 306. The OTP memory address is provided to cache controller 402. Cache controller 402 selects a line within cache memory 404 based on the OTP memory address-x as shown in step 806. In one embodiment cache controller 402 selects a cache line by performing a Modulo calculation on the OTP memory address. The result of the calculation identifies the cache line number. The tag in the selected cache line is compared with the upper bits of the OTP memory address. If there is a match in step 812, then in step 822 cache controller 402 reads the repair data from the selected cache line with the matching tag. This repair data is provided to repair controller 332 for subsequent storage in repair register selected in step 802 as shown in 824. Cache controller 402 may check a parity bit against its corresponding repair data before the repair data is provided to repair controller. If, however, there is no match found in step 812 cache controller 402 selects another cache line based on the OTP memory address. In one embodiment this other cache line is selected by first adding an integer (e.g., eight) to the OTP memory address. Cache controller 402 then performs the Modulo operation on the modified OTP memory address. The result of the Modulo calculation identifies the other cache line. Cache controller 402 accesses the other cache line and compares the tag in it with the upper bits of unmodified OTP memory address as shown in step 820. If there is a match, then cache controller 402 reads the repair data from the other cache line with the matching tag as shown in step 822. This repair data is provided to repair controller 332 for subsequent storage in the selected repair register 118 as shown in step 824. In one embodiment, the cache controller 402 might generate an error if the other cache line lacks a matching tag.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as data, bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "performing," "generating," "determining," "placing," or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus for performing the operations herein. This apparatus may be specially constructed for the required purposes, or it may comprise firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
storing first data to a first register;
storing the first data in non-volatile memory at a first address thereof, wherein the first address corresponds to the first register;
selecting a first location in a cache memory based on the first address;
storing the first data and a portion of the first address in the selected first location, wherein the first data comprises repair data indicating faults associated with a plurality of memory cells in a volatile memory;
performing, based on the repair data, a repair operation to repair the plurality of memory cells in the volatile memory;
determining that the repair operation did not repair a subset of the plurality of memory cells; and
compressing, responsive to determining that the repair operation did not repair the particular memory cell of the plurality of memory cells, the repair data without compressing a first portion of the repair data associated with the particular memory cell of the plurality of memory cells.

2. The method of claim 1 further comprising:
testing the volatile memory to identify a row or a column in the volatile memory, which contains a faulty memory cell.

3. The method of claim 1 further comprising:
storing second data to a second register;
storing the second data in the non-volatile memory at a second address thereof, wherein the second address corresponds to the second register;
selecting a second location in the cache memory based on the second address; and
storing the second data and a portion of the second address in the selected second location.

4. The method of claim 1 wherein selecting the first location comprises:
performing a Modulo operation on the first address to generate a remainder value;
accessing the first location, which corresponds to the remainder value;
determining whether the first location in the cache memory comprises non-zero data; and
selecting the first location in response to determining the first location does not comprise non-zero data.

5. The method of claim 3 wherein selecting the second location comprises:
performing a Modulo operation on the second address to generate a remainder value;
accessing the first location, which corresponds to the remainder value;
determining whether the first location in the cache memory comprises non-zero data; and
selecting the second location in response to determining the first location comprises non-zero data.

6. The method of claim 5 wherein selecting the second location further comprises:
modifying the second address to create a modified second address in response to determining the first location comprises non-zero data;
performing a Modulo operation on the modified second address to generate another remainder value;
accessing the second location, which corresponds to the other remainder value;
determining whether the second location in the cache memory comprises non-zero data; and
selecting the second location in response to determining the second location does not comprise non-zero data.

7. The method of claim 3 further comprising:
mapping a third register to a third address in the non-volatile memory;
selecting a third location in the cache memory based on the third address;
reading a memory address portion from the selected third location;
comparing the memory address portion to a portion of the third address;
reading third data from the third location in response to comparing the memory address portion to the portion of the third address; and
storing the third data in the third register.

8. The method of claim 7 further comprising:
before the reading the memory portion and before the reading of the third data, reading the third data from the non-volatile memory at the third address thereof;
selecting the third location in the cache memory based on the third address; and
storing the third data read from the non-volatile memory in the third location of the cache memory.

9. An apparatus comprising:
an integrated circuit comprising:
a built-in self-test-and-repair (BISTR) circuit comprising a controller;
a data cache in data communication with the controller;
a plurality of registers; and
wherein the controller is configured to:
store data read from the data cache into a first of the plurality of registers, wherein the data comprises repair data indicating faults associated with a plurality of memory cells in a volatile memory;
perform, based on the repair data, a repair operation to repair the plurality memory cells in the volatile memory;
determine that the repair operation did not repair a subset of the plurality of memory cells; and
compress, responsive to determining that the repair operation did not repair the particular memory cell of the plurality of memory cells, the repair data without compressing a first portion of the repair data associated with the particular memory cell of the plurality of memory cells.

10. The apparatus of claim 9 further comprising:
a non-volatile memory;
wherein the data cache comprises:
a data cache controller in data communication with a data cache memory;
wherein the data cache controller is configured to store data in the cache memory that is received from the non-volatile memory or the BISTR circuit controller.

11. The apparatus of claim 10 wherein the data cache controller is configured to select a location in the data cache memory for storing data, wherein the selection is based on an address in the non-volatile memory.

12. The apparatus of claim 10 wherein the data cache controller is configured to perform a Modulo operation on an address of the non-volatile memory, and wherein the data cache controller is configured to select a location in the data cache memory for storing data based on a remainder value of the Modulo operation.

13. The apparatus of claim 9:
wherein the BISTR circuit is configured for testing the volatile memory to identify a row or a column in the volatile memory, which contains a faulty memory cell.

14. The apparatus of claim 10:
wherein the BISTR circuit controller is configured to translate an identity of any of the plurality of registers into a respective address in the non-volatile memory; and
wherein the data cache controller is configured to store the data in a location in the cache memory based on an address received from the BISTR circuit controller.

15. A method comprising:
reading first data from a non-volatile memory of an integrated circuit (IC) at a first address thereof;
storing the first data in a data cache of the IC;
reading the first data from the data cache; and
storing the first data read from the data cache into a register of a first volatile memory of the IC, wherein the first volatile memory comprises rows and columns of memory cells, a redundant row of memory cells, and a redundant column of memory cells;
wherein the first data comprises repair data indicating faults associated with a plurality of memory cells;
performing, based on the repair data, a repair operation to repair the plurality of memory cells in the volatile memory;
determining that the repair operation did not repair a subset of the plurality of memory cells; and
compressing, responsive to determining that the repair operation did not repair the particular memory cell of the plurality of memory cells, the repair data without compressing a first portion of the repair data associated with the particular memory cell of the plurality of memory cells.

16. The method of claim 15 is implemented in response to supplying power to the IC.

17. The method of claim 16 further comprising:
translating an identity of the repair register into an address of the non-volatile memory; and
reading the first data from volatile memory of the data cache at a memory location that corresponds to the address.

18. The method of claim 17 further comprising:
translating an identity of the register into an address of the non-volatile memory;
performing a Modulo operation on the address to generate a remainder value; and
reading the first data from volatile memory of the data cache at a memory location that corresponds to the remainder value.

19. The method of claim 18 further comprising storing second data in the non-volatile memory at a second address thereof, wherein the second data is stored in the non-volatile memory after power is supplied to the IC.

20. The method of claim 19 further comprising:
storing the second data in the data cache;
reading the second data from the data cache;
storing the second data read from the data cache into a register of a second volatile memory of the IC, wherein the second volatile memory comprises rows and columns of memory cells, the redundant row of memory cells, and the redundant column of memory cells; and
wherein the second data maps one of the rows or one of the columns of the second memory to the redundant row or the redundant column of the second memory.

\* \* \* \* \*